(12) United States Patent
Nakajima

(10) Patent No.: US 7,651,901 B2
(45) Date of Patent: Jan. 26, 2010

(54) SEMICONDUCTOR DEVICE AND METHOD OF MANUFACTURING SAME

(75) Inventor: Kazuaki Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 11/585,846

(22) Filed: Oct. 25, 2006

(65) Prior Publication Data

US 2007/0090427 A1  Apr. 26, 2007

(30) Foreign Application Priority Data

Oct. 25, 2005  (JP) ............... 2005-310392

(51) Int. Cl.
*H01L 21/8238* (2006.01)
(52) U.S. Cl. ............... 438/199; 438/230; 257/E21.632
(58) Field of Classification Search ........... 438/199, 438/299, 230
See application file for complete search history.

(56) References Cited

U.S. PATENT DOCUMENTS 6,992,357 B2   1/2006  Matsuo et al.
7,344,934 B2 *  3/2008  Li .................. 438/199
2002/0151125 A1  10/2002  Kim et al.

OTHER PUBLICATIONS

Chow et al., "Plasma Etching of Refractory Gates for VLSI Applications," J. Electrochm. Soc. (Oct. 1984), 131:2325-35.
Cartier, et al., "Systematic study of pFET $V_t$ with Hf-based gate stacks with poly-Si and FUSI gates", Symposium of VLSI Technology, Digest of Technical Papers, pp. 44-45, (2004).

* cited by examiner

*Primary Examiner*—Jack Chen
(74) *Attorney, Agent, or Firm*—Finnegan, Henderson, Farabow, Garrett & Dunner, L.L.P.

(57) ABSTRACT

A method of manufacturing a semiconductor device, comprises: forming a high dielectric gate insulating film in an nMIS formation region and a pMIS formation region of a semiconductor substrate; forming a first metal film on the high dielectric gate insulating film, the first metal film; removing the first metal film in the nMIS formation region; forming a second metal film on the high dielectric gate insulating film of the nMIS formation region and on the first metal film of the pMIS formation region; and processing the first metal film and the second metal film. The high dielectric gate insulating film has a dielectric constant higher than a dielectric constant of silicon oxide. The first metal film does not contain silicon and germanium. The second metal film contains at least one of silicon and germanium.

10 Claims, 7 Drawing Sheets

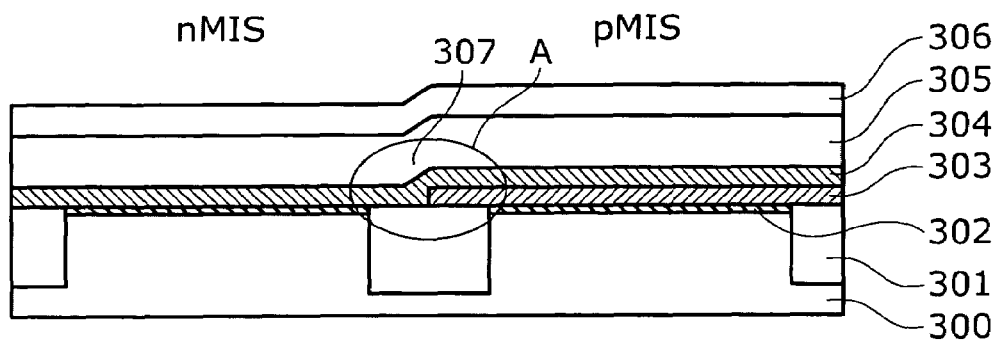
FIG. 4A
FIG. 4A-1
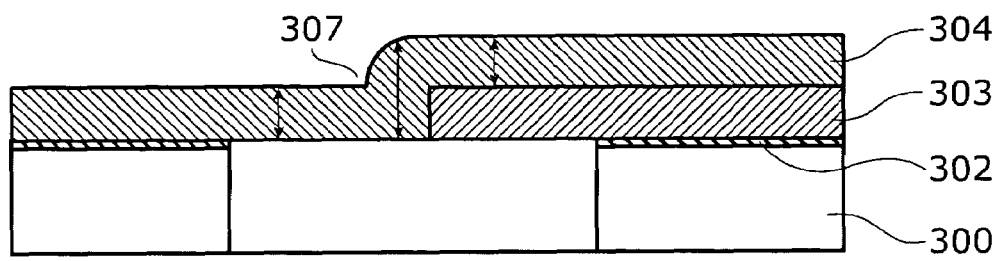
FIG. 4B
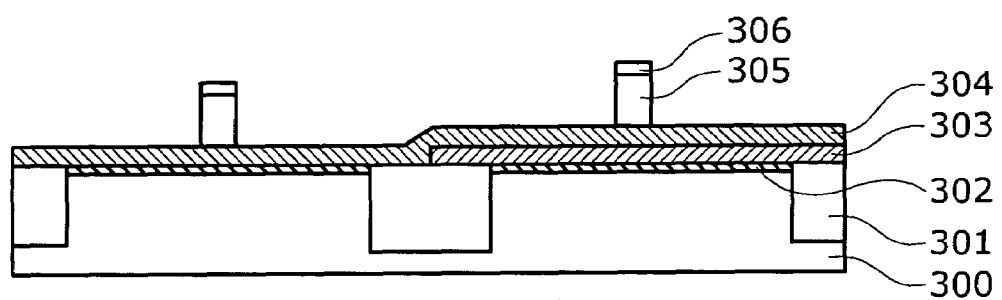
FIG. 4C
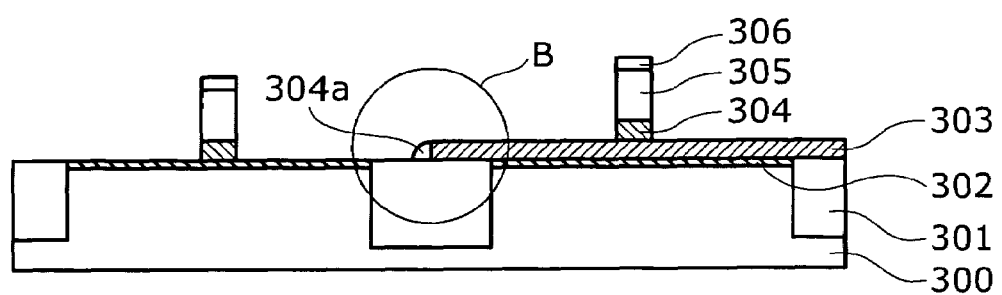
FIG. 4C-1
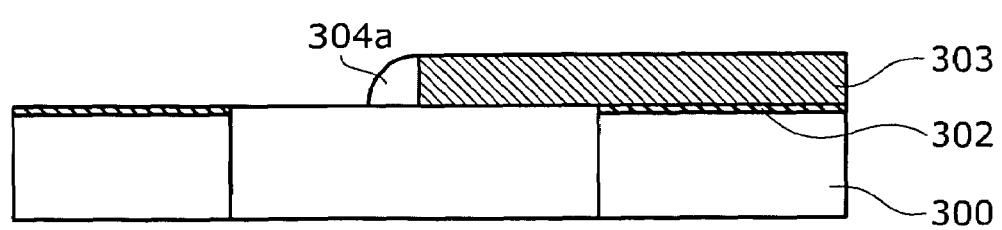

SEMICONDUCTOR DEVICE AND METHOD OF MANUFACTURING SAME

CROSS-REFERENCE TO RELATED APPLICATIONS

This application is based upon and claims the benefit of priority from the prior Japanese Patent Application No. 2005-310392, filed on Oct. 25, 2005; the entire contents of which are incorporated herein by reference.

BACKGROUND OF THE INVENTION

1. Field of the Invention

This invention relates to a semiconductor device and a method of manufacturing the same, and more particularly to a MISFET (Metal Insulator Semiconductor Field Effect Transistor) having a dual metal gate electrode structure and a method of manufacturing the same.

2. Background Art

In recent years, MISFET devices have been downscaled for achieving high performance. However, downscaling involves thinning of the gate oxide film, which causes the problems of increased gate leak current or depletion of the gate electrode.

In order to avoid these problems, the gate leak current may be reduced by replacing the gate insulating film with a high dielectric film whose dielectric constant is higher than silicon oxide to gain physical thickness, and the gate electrode may be metallized to prevent the depletion of the gate electrode.

However, in a MISFET having a metal gate electrode structure, the threshold voltage of the transistor is determined by the impurity concentration of the channel region and the work function of the gate electrode. Therefore, to obtain a desired threshold voltage, a dual metal gate structure is required where the nMIS gate electrode is made of a metal material having a work function of 4.3 eV or less and the pMIS gate electrode is made of a metal material having a work function of 4.8 eV or more.

However, when a metal gate electrode containing silicon is formed on the high dielectric gate insulating film, the high dielectric gate insulating film material reacts with silicon contained in the metal gate electrode between the gate insulating film and the metal gate electrode, thereby varying the work function of the metal gate electrode. This may cause a problem of being unable to obtain the desired threshold voltage (see, e.g., E. Cartier et al., "Systematic study of pFET Vt with Hf-based gate stacks with poly-Si and FUSI gates", Proc. Symp. on VLSI Tech. Digest, pp. 44-45, 2004).

SUMMARY OF THE INVENTION

According to an aspect of the invention, there is provided a method of manufacturing a semiconductor device, comprising: forming a high dielectric gate insulating film in an nMIS formation region and a pMIS formation region of a semiconductor substrate, the high dielectric gate insulating film having a dielectric constant higher than a dielectric constant of silicon oxide; forming a first metal film on the high dielectric gate insulating film, the first metal film not containing silicon and germanium; removing the first metal film in the nMIS formation region; forming a second metal film on the high dielectric gate insulating film of the nMIS formation region and on the first metal film of the pMIS formation region, the second metal film containing at least one of silicon and germanium; and processing the first metal film and the second metal film.

According to other aspect of the invention, there is provided a semiconductor device comprising: a semiconductor substrate having an nMIS formation region and a pMIS formation region; a high dielectric gate insulating film formed on the nMIS formation region and the pMIS formation region, the high dielectric gate insulating film having a dielectric constant higher than silicon oxide; a first metal film formed on the high dielectric gate insulating film on the pMIS formation region, the first metal film not containing silicon and germanium; a second metal film formed on the high dielectric gate insulating film on the nMIS formation region and on the first metal film, the second metal film containing at least one of silicon and germanium; and a conductive film formed on the second metal film, the conductive film having a resistance lower than resistances of the first metal film and the second metal film.

BRIEF DESCRIPTION OF THE DRAWINGS

FIGS. 4 and 5 illustrate a problem that occurs when the major metallic elements contained in the first metal film and in the second metal film according to the first embodiment of the invention belong to different groups.

DETAILED DESCRIPTION OF THE INVENTION

A semiconductor device and a method of manufacturing the same according to the embodiments of the invention will now be described with reference to the drawings.

First Embodiment

Figure 5A:
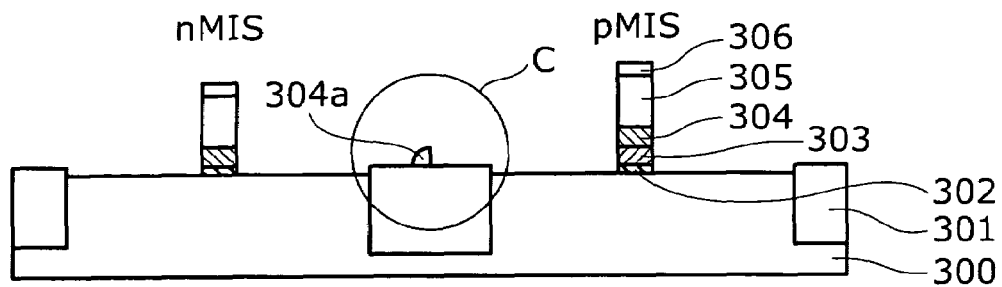
Figures 1, 5A:
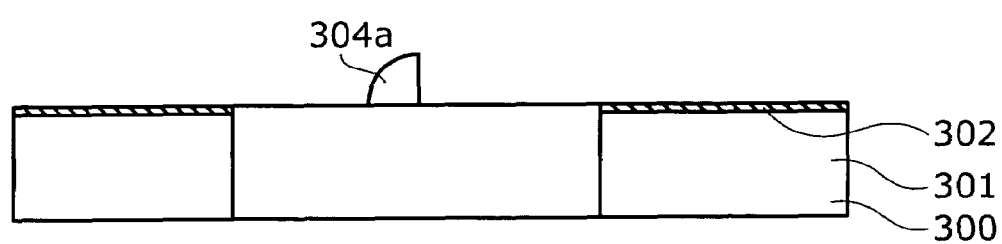
Figures 2, 5A:
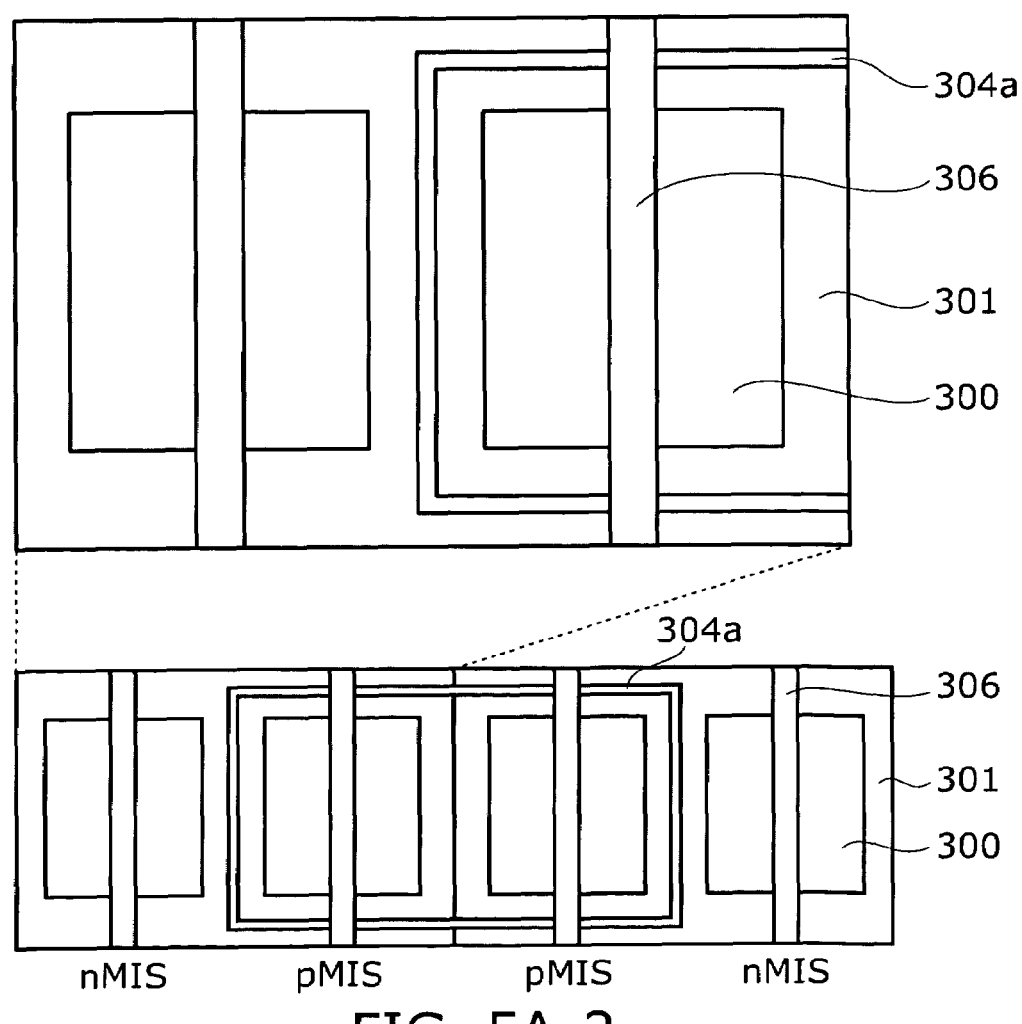

FIGS. 1 and 2 are process cross sections showing a method of manufacturing a MISFET having a dual metal gate electrode structure according to a first embodiment of the invention.

Figure 1A:
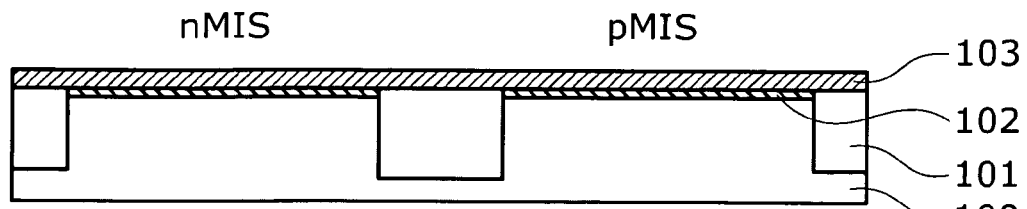
FIGS. 1 and 2 are process cross sections showing a method of manufacturing a semiconductor device according to a first embodiment of the invention.

First, as shown in FIG. 1A, device isolations 101 are formed at the surface of a semiconductor substrate, for example, a single crystal silicon substrate 100. Next, as a high dielectric gate insulating film whose dielectric constant is higher than silicon oxide, a gate insulating film 102 containing hafnium (Hf) is formed over the upper surface of the single crystal silicon substrate 100 by chemical vapor deposition (hereinafter simply referred to as CVD) or other method using an organic source. Subsequently, a first metal film that does not contain silicon and germanium, for example, a WN film 103 having a work function of 4.9 eV, is formed with a film thickness of 10 nm over the upper surface of the gate insulating film 102 by CVD or other method.

Figure 1B:
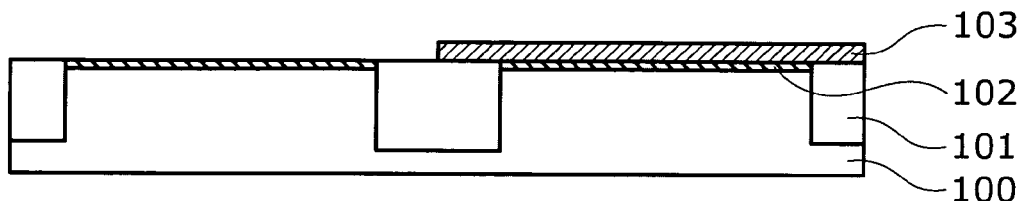

Next, as shown in FIG. 1B, for example, the WN film 103 in the pMIS formation region is masked with a photoresist, and the WN film 103 on the nMIS formation region is etched away using an etching liquid such as hydrogen peroxide solution, with the WN film 103 left behind on the pMIS formation region.

Figure 1C:
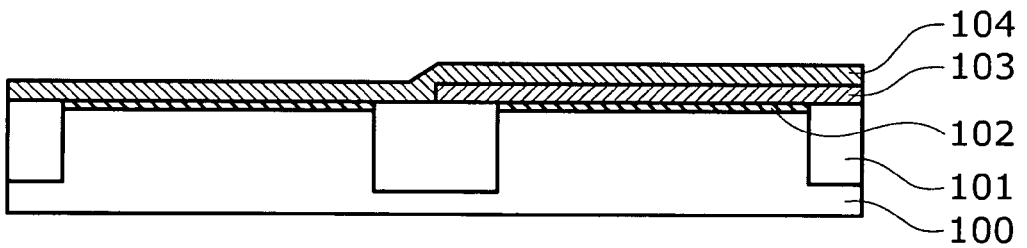

Furthermore, as shown in FIG. 1C, a second metal film containing silicon or germanium, for example, a WSiN film 104 having a work function of 4.2 eV, is formed with a film thickness of 10 nm on the gate insulating film 102 of the nMIS formation region and on the WN film 103 of the pMIS formation region by CVD or other method.

In this embodiment, as described above, a WN film 103 is formed first over the upper surface of the gate insulating film 102. Then, with the WN film 103 left behind on the gate insulating film 102 of the pMIS formation region, the WN film 103 on the gate insulating film 102 of the nMIS formation region is removed. Next, a WSiN film 104 is formed on the gate insulating film 102 of the nMIS formation region and on the WN film 103 of the pMIS formation region. This sequence of steps is very important, and the reason is described below with reference to FIG. 3.

FIG. 3 shows process cross sections illustrating a method of manufacturing a MISFET having a dual metal gate electrode structure where the steps of forming the first metal film and forming the second metal film are reversed as opposed to FIG. 1.

Figure 3A:
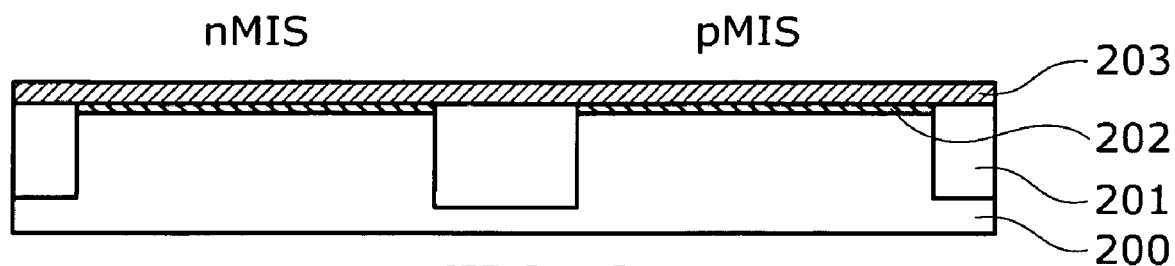
FIG. 3 shows process cross sections for illustrating a problem that occurs when the steps of forming the first metal film and forming the second metal film according to the first embodiment of the invention are reversed.

First, for example, as shown in FIG. 3A, a gate insulating film 202 containing hafnium (Hf) is formed as a high dielectric gate insulating film over the upper surface of a single crystal silicon substrate 200 having device isolations 201. Then a WSiN film 203 is formed on the gate insulating film 202.

Figure 3B:
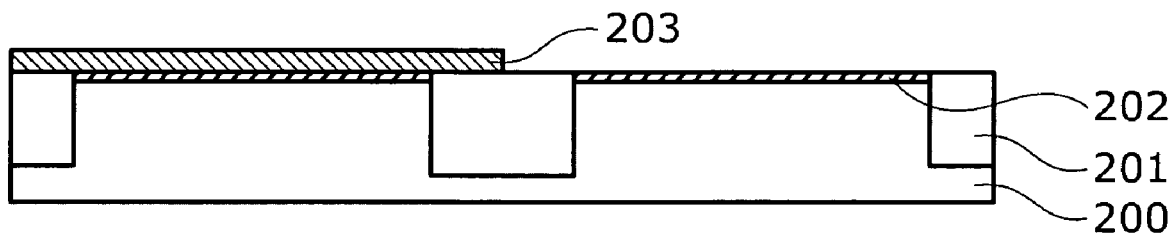

Next, as shown in FIG. 3B, the WSiN film 203 in the pMIS formation region is etched away with the WSiN film 203 in the nMIS formation region left behind.

Figure 3C:
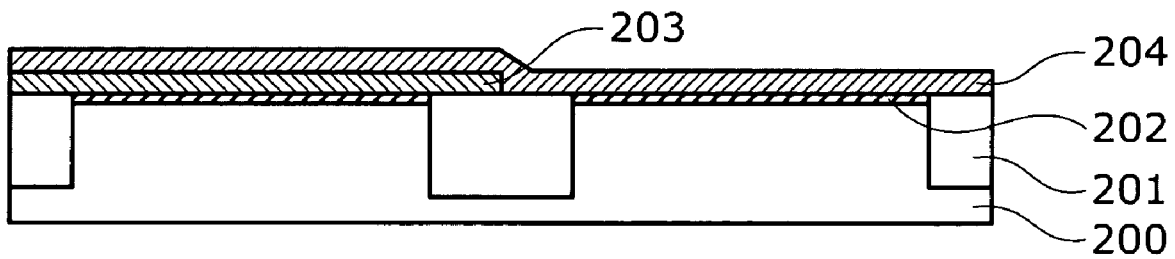

Next, as shown in FIG. 3C, a WN film 204 is formed on the WSiN film 203 of the nMIS formation region and on the gate insulating film 202 of the pMIS formation region.

It is known that, when a WSiN film 203 is thus formed on the gate insulating film 202 containing Hf, Hf is combined with silicon to form a Hf silicide layer at the interface between the gate insulating film 202 and the WSiN film 203. In addition, it is believed that, even if the WSiN film 203 is subsequently removed, it is very difficult to completely remove the Hf silicide layer once formed.

Therefore, when the WSiN film 203 formed on the gate insulating film 202 of the pMIS formation region is removed and then a WN film 204 is formed on the gate insulating film 202 of the pMIS formation region, a Hf silicide layer remains between the gate insulating film 202 and the WN film 204. Thus the Hf silicide layer will affect the work function of the gate electrode of the pMIS formation region.

Hence, even though the WN film formed on the gate insulating film 202 of the pMIS formation region has a work function of 4.9 eV, the work function of the gate electrode of the pMIS formation region is reduced to less than 4.9 eV under the influence of the Hf silicide layer having a work function of 4.2 eV. As a result, the gate electrode of the pMIS formation region cannot have a work function of 4.8 eV or more, which inevitably increases the threshold voltage of the transistor. Thus it becomes impossible to manufacture a reliable semiconductor device having a dual metal gate structure.

Furthermore, even if silicon in the above-described WSiN film 203 is replaced by germanium, a reaction layer of Hf and germanium is formed similarly, which may cause a problem of varying the work function of the gate electrode of the pMIS formation region.

For the above reason, this embodiment uses the above-described sequence of steps. That is, a WN film 103 is formed first on the gate insulating film 102 of the pMIS formation region, and then a WSiN film 104 is formed on the WN film 103. Thus, because the WSiN film 104, which is a metal film containing silicon, is never formed directly on the gate insulating film 102 of the pMIS formation region, no Hf silicide layer is formed on the gate insulating film 102 of the pMIS formation region. Therefore the pMISFET gate electrode has a work function of 4.9 eV, which is the work function of the WN film 103. This satisfies the work function requirement of 4.8 eV or more, required for pMISFET gate electrodes.

On the other hand, because the WSiN film 104 is formed directly on the gate insulating film 102 of the nMIS formation region, a Hf silicide layer is formed between the gate insulating film 102 and the WSiN film 104. Therefore the work function of the nMISFET gate electrode is affected by the Hf silicide layer. However, the Hf silicide layer has a work function of 4.2 eV, which satisfies the work function requirement of 4.3 eV or less, required for nMISFET gate electrodes. Thus the formation of a Hf silicide layer causes no problem.

Figure 1D:
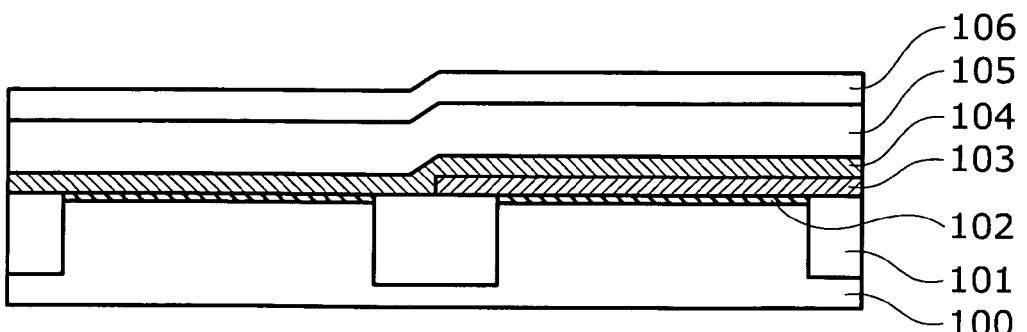

The description of the process of manufacturing a MISFET having a dual metal gate electrode structure according to the first embodiment of the invention is now continued. As shown in FIG. 1D, a polycrystalline silicon film 105, for example, is formed as a silicon film over the upper surface of the WSiN film 104 by CVD or other method. Then a photoresist is selectively formed on the polycrystalline silicon 105 of the nMIS formation region or the pMIS formation region. With this photoresist being masked, $As^+$ ions are injected into the polycrystalline silicon film 105 of the nMIS formation region, and $B^+$ ions are injected into the polycrystalline silicon film 105 of the pMIS formation region. Furthermore, a silicon nitride film 106 is formed over the upper surface of the polycrystalline silicon film 105 by CVD or other method.

Figure 1E:
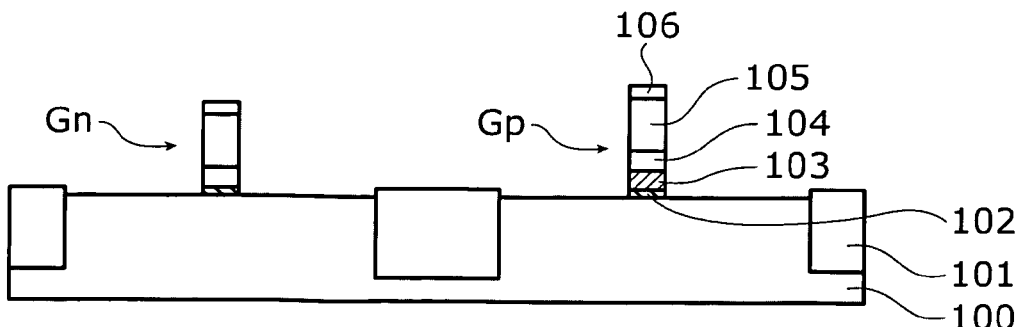

Next, as shown in FIG. 1E, the silicon nitride film 106, the polycrystalline silicon film 105, the WSiN film 104, and the WN film 103 are processed by anisotropic etching to simultaneously form gate electrodes Gn, Gp having a gate length of 30 nm, for example, in the nMIS formation region and in the pMIS formation region, respectively. This anisotropic etching is conducted by dry etching with a plasma of $CF_4$ gas, for example.

In this embodiment, the major metallic element contained in the first metal film, WN film 103, and in the second metal film, WSiN film 104, is the W element in group VIa of the periodic table. In the following, reference is made to FIGS. 4 and 5 to describe a problem that occurs when the major metallic elements contained in the first metal film 103 and in the second metal film 104 are not in the same group of the periodic table.

FIGS. 4 and 5 illustrate a method of manufacturing a MISFET having a dual metal gate electrode structure where the first metal film and the second metal film shown in FIG. 1 contain metallic elements in different groups of the periodic table.

First, as shown in FIG. 4A, a gate insulating film 302 containing Hf is formed as a high dielectric gate insulating film on a single crystal silicon substrate 300 having device isolations 301. Then a first metal film that does not contain silicon and germanium, for example, a TiN film 303 having a work function of 4.8 eV, is formed on the gate insulating film 302 by CVD method.

Next, the TiN film 303 in the nMIS formation region is etched away with the TiN film 303 in the pMIS formation region left behind. Then a second metal film containing silicon, for example, a TaSiN film 304 having a work function of 4.2 eV, is formed on the gate insulating film 302 of the nMIS formation region and the TiN film 303 of the pMIS formation region. Here, as shown in FIG. 4A-1, which is an enlarged view of the portion surrounded by the circle A in FIG. 4A, the TaSiN film 304 is typically formed thicker at the peripheral vicinity 307 of the TiN film 303 than outside the peripheral vicinity 307. Subsequently, a polycrystalline silicon film 305 is formed on the TaSiN film 304. Then a photoresist is selectively formed on the polycrystalline silicon 305 of the nMIS formation region or the pMIS formation region. With the photoresist being masked, As+ ions are injected into the polycrystalline silicon film 305 of the nMIS formation region, and B+ ions are injected into the polycrystalline silicon film 305 of the pMIS formation region. Furthermore, a silicon nitride film 306 is formed on the polycrystalline silicon film 305.

Next, as shown in FIG. 4B, the silicon nitride film 306 and the polycrystalline silicon film 305 are anisotropically etched into a desired pattern with a plasma of $CF_4$ gas, for example.

Next, as shown in FIG. 4C, the laminated pattern of the polycrystalline silicon film 305 and the silicon nitride film 306 is used as a mask to dry etch the TaSiN film 304 with a plasma of $CF_4$ gas, for example. Here, as shown in FIG. 4C-1, which is an enlarged view of the portion surrounded by the circle B in FIG. 4C, even if the thin portion of the TaSiN film 304 outside the peripheral vicinity 307 of the TiN film 303 on the gate insulating film 302 of the nMIS formation region and the TiN film 303 of the pMIS formation region can be removed, the thick portion of the TaSiN film 304 at the peripheral vicinity 307 of the TiN film is etched insufficiently, and a portion of the TaSiN film 304 will stay behind (this portion is hereinafter referred to as residue 304a).

Subsequently, as shown in FIG. 5A, and FIG. 5A-1, which is an enlarged view of the portion surrounded by the circle C in FIG. 5A, even if the TiN film 303 is dry etched with a plasma of HBr gas, the residue 304a will still stay behind because it is not removed with the plasma of $CF_4$ gas.

The reason for this is as follows. As described in T. P. Chow and A. J. Steckle, "Plasma Etching of Refractory Gates for VLSI Applications", J. Electrochem. Soc., Vol. 131, pp. 2325-2335 (1985), because halides of metallic elements have greatly different boiling points depending on the metals, the gate metal materials are difficult to dry etch with the same halogen gas in the case of metallic elements in different groups of the periodic table, while the metal materials can be dry etched with the same halogen gas in the case of metallic elements in the same group.

The residue 304a may produce dust in subsequent steps, which results in decreased yield. In addition, as shown in FIG. 5A-2, which is a plan view of FIG. 5A, the residue 304a is formed so as to surround the pMIS formation region, which may cause short circuit between interconnects.

Therefore, in this embodiment, the gate metal electrodes of the nMIS formation region and the pMIS formation region are composed of metallic elements in the same group of the periodic table. That is, as shown in FIG. 1E, the gate electrode of the nMIS formation region is made of a monolayer of the WSiN film 104, and the gate electrode of the pMIS formation region is made of a lamination of the WSiN film 104 and the WN film 103. Hence the monolayer of the WSiN film 104 on the nMIS formation region and the lamination of the WN film 103 and the WSiN film 104 on the pMIS formation region can be anisotropically etched using the same etching gas, and thus the residue as described above is not formed.

The description of the process of manufacturing a MISFET having a dual metal gate electrode structure according to the first embodiment of the invention is now continued with reference to FIG. 2.

Figure 2A:
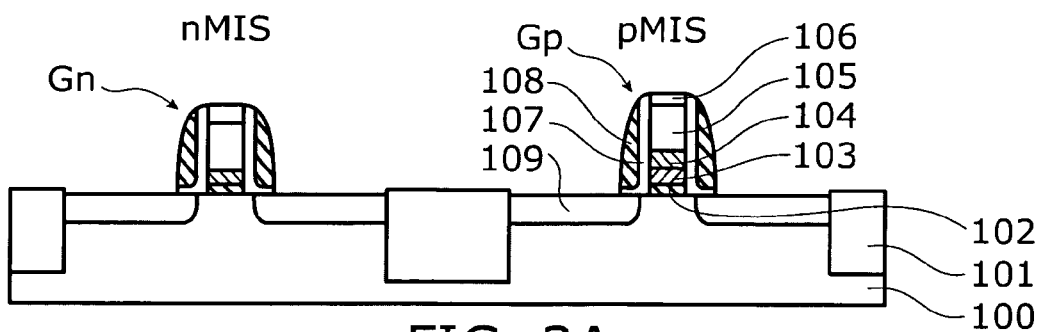

As shown in FIG. 2A, a silicon nitride film 107 and a silicon oxide film 108 are deposited over the single crystal silicon substrate 100 and the gate electrodes Gn, Gp by CVD method, for example. Then the silicon oxide film 108 and the silicon nitride film 107 are etched back by dry etching with a plasma of $CF_4$, for example, to make a configuration where the sidewall portion of the gate electrodes Gn, Gp is surrounded by the silicon nitride film 107 and the silicon oxide film 108.

Furthermore, the pMIS formation region is covered with a photoresist or the like, and the gate electrode Gn is used as a mask to inject P+ ions into the nMIS formation region. The nMIS formation region is covered with a photoresist or the like, and the gate electrode Gp is used as a mask to inject B+ ions into the pMIS formation region. Heat treatment is applied at 1030° C. for 5 seconds to form a deep diffusion layer 109 serving as a source/drain.

Figure 2B:
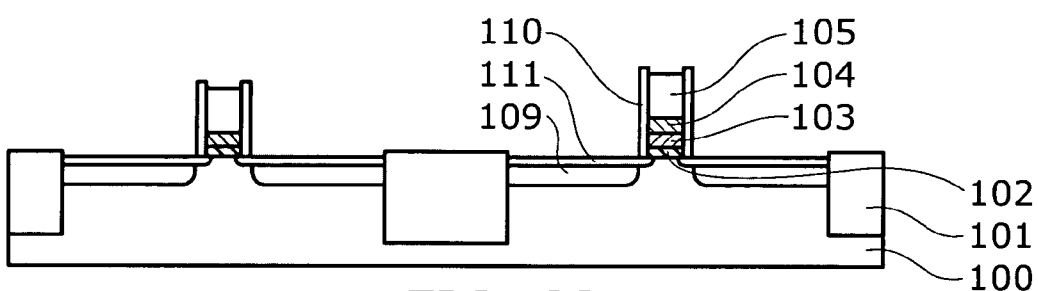

Subsequently, as shown in FIG. 2B, the silicon nitride film 107 and the silicon oxide film 108 on the sidewall portion of the gate electrodes Gn, Gp are removed by dry etching with a plasma of $CF_4$, for example. At this time, the silicon nitride film 106 on top of the gate electrodes Gn, Gp is also removed simultaneously. Next, a silicon nitride film 110 is deposited over the single crystal silicon substrate 100 and the gate electrodes Gn, Gp using CVD method, for example. Then the silicon nitride film 110 is etched back by dry etching with a plasma of $CF_4$, for example, to make a configuration where the sidewall portion of the gate electrodes Gn, Gp is surrounded by the silicon nitride film 110.

Furthermore, the pMIS formation region is covered with a photoresist or the like, and the gate electrode Gn is used as a mask to inject As+ ions into the nMIS formation region. The nMIS formation region is covered with a photoresist or the like, and the gate electrode Gp is used as a mask to inject B+ ions into the pMIS formation region. Heat treatment is applied at 800° C. for 5 seconds to form a shallow diffusion layer 111 serving as a source/drain.

Figure 2C:
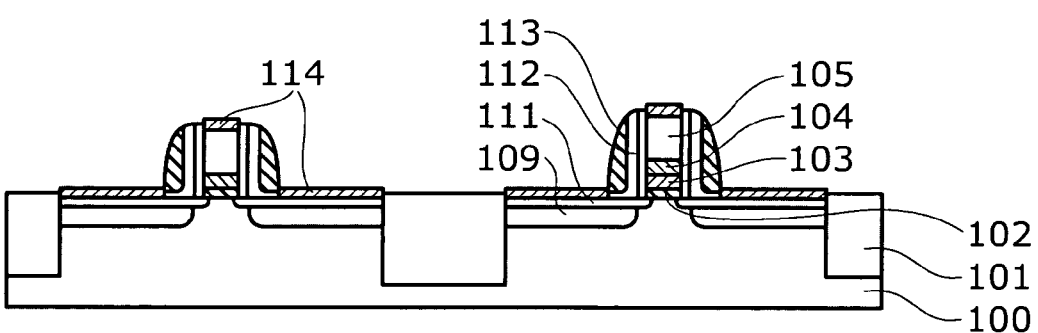

Next, as shown in FIG. 2C, a silicon nitride film 112 and a silicon oxide film 113 are deposited again over the single crystal silicon substrate 100 and the gate electrodes Gn, Gp by CVD method, for example. Then the silicon oxide film 113 and the silicon nitride film 112 are etched back by dry etching with a plasma of $CF_4$, for example, to make a configuration where the sidewall portion of the gate electrodes Gn, Gp is surrounded by the silicon nitride film 112 and the silicon oxide film 113.

Then a Ni film is deposited over the upper surface of the single crystal silicon substrate 100 to a film thickness of 10 nm by CVD or other method, for example. Heat treatment is applied at 350° C. for about 30 seconds to allow Ni to react with the single crystal silicon substrate 100. Subsequently, the unreacted Ni film is removed by an etching liquid of, for example, a mixture of sulfuric acid and hydrogen peroxide solution. Then heat treatment is applied at 500° C. for about 30 seconds. At this time, a silicide layer 114 is formed on top of the gate electrodes Gn, Gp and on the upper surface of the shallow diffusion layer 111.

While the silicide layer 114 is formed on top of the gate electrodes Gn, Gp so as to leave most of the polycrystalline silicon film 105, the polycrystalline silicon film 105 of the gate electrodes Gn, Gp may be entirely turned into a silicide layer.

Figure 2D:
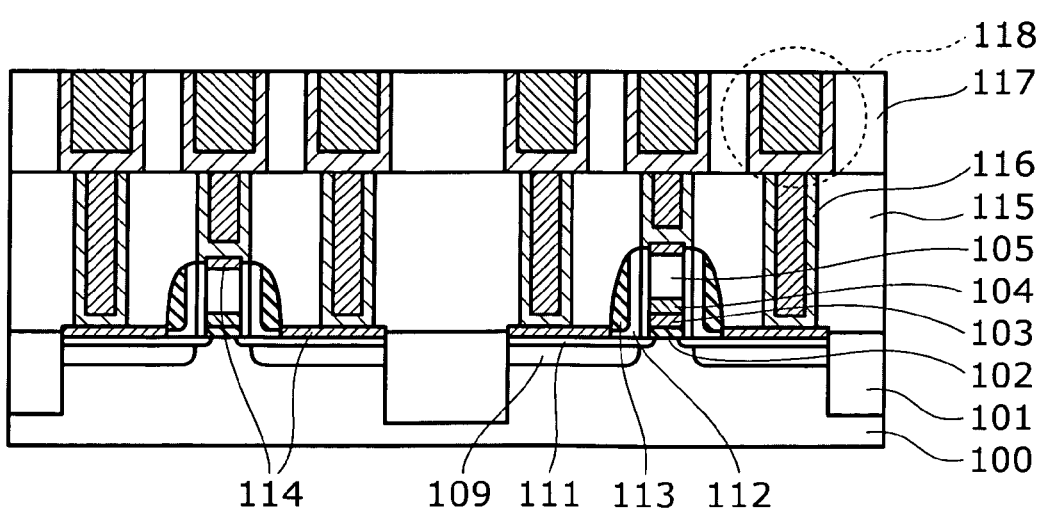

Next, as shown in FIG. 2D, a first interlayer film 115 is deposited on the single crystal silicon substrate 100 by CVD method, for example. Then a desired contact pattern is formed by lithography. A Ti/TiN/W film, for example, is buried inside the contact pattern and planarized by CMP method to form a contact 116. Next, a second interlayer film 117 is deposited on the first interlayer film 115 and on the contact 116 by CVD method, for example. Then a desired groove pattern is formed by lithography. Subsequently, a TaN/Cu film, for example, is buried inside the groove and planarized by CMP method to form a Cu interconnect 118 that electrically connects the contact 116.

The foregoing process results in an FET having a dual metal gate structure made of an nMISFET gate electrode having a work function of 4.2 eV and a pMISFET gate electrode having a work function of 4.9 eV.

As described above, according to this embodiment, a metal electrode material containing silicon or germanium is not directly formed on the high dielectric gate insulating film of the pMIS formation region to prevent the variation of the work function of the gate electrode in the pMIS formation region. Thus it becomes possible to manufacture a reliable semiconductor device having a dual metal gate structure with a desired threshold voltage made of an nMISFET gate electrode having a work function of 4.2 eV and a pMISFET gate electrode having a work function of 4.9 eV.

Furthermore, according to this embodiment, the first metal film serving as a gate electrode material of the pMISFET and the second metal film serving as a gate electrode material of the nMISFET use metal materials such that the major metallic elements contained in the metal films are in the same group of the periodic table. Therefore the gate electrodes of the nMISFET and the pMISFET can be processed with the same etching gas, which facilitates manufacturing a semiconductor device having a dual metal gate structure. Moreover, even if a portion of the second metal film stays behind at the peripheral vicinity of the first metal film in etching the second metal film, it can be etched away together with the first metal film during etching the first metal film. Thus it becomes possible to manufacture a semiconductor device having a dual metal gate structure without decreasing yield.

Furthermore, when a metal film containing nitrogen such as the WSiN film 104 is formed as a second metal film under the polycrystalline silicon film 105, this metal film containing nitrogen serves, during the heat treatment step, as a barrier layer for preventing the polycrystalline silicon film 105 from reacting with the first metal film formed under the metal film containing nitrogen. Thus the sheet resistance of the gate electrode can be improved.

While the WN film 103 and the WSiN film 104 are used, respectively, as the first metal film and the second metal film serving as gate electrode materials in this embodiment, the first metal film and the second metal film may be changed to metal films that do not contain nitrogen such as a W film and a WSi film, or a WC film and a WSiC film, or a WB film and a WSiB film. In this case, nitrogen is preferably contained in the superficial portion of the second metal film being in contact with the polycrystalline silicon film 105. By allowing the superficial portion of the second metal film to contain nitrogen, the polycrystalline silicon film 105 does not react, during the heat treatment step, with the portion of the first metal film or the second metal film that does not contain nitrogen. Thus the sheet resistance of the gate electrode can be improved.

Second Embodiment

FIGS. 6 and 7 are process cross sections showing a method of manufacturing a MISFET according to a second embodiment of the invention.

Figure 6A:
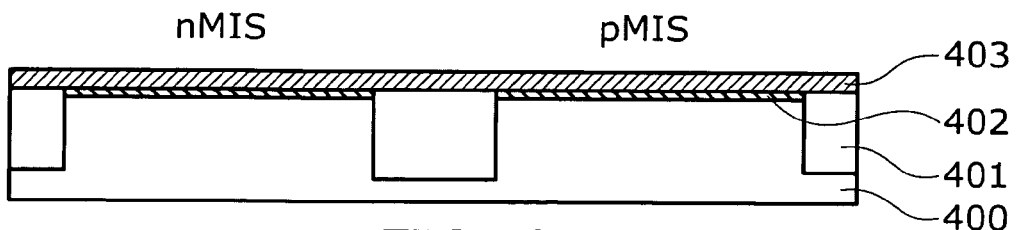
FIGS. 6 and 7 are process cross sections showing a method of manufacturing a semiconductor device according to a second embodiment of the invention.

First, as shown in FIG. 6A, a gate insulating film 402 containing Hf is formed as a high dielectric gate insulating film over the upper surface of a semiconductor substrate, for example, a single crystal silicon substrate 400 having device isolations 401. Then a first metal film that does not contain silicon and germanium and has a work function of 4.8 eV, for example, a TiN film 403, is formed with a film thickness of 10 nm over the upper surface of the gate insulating film 402.

Figure 6B:
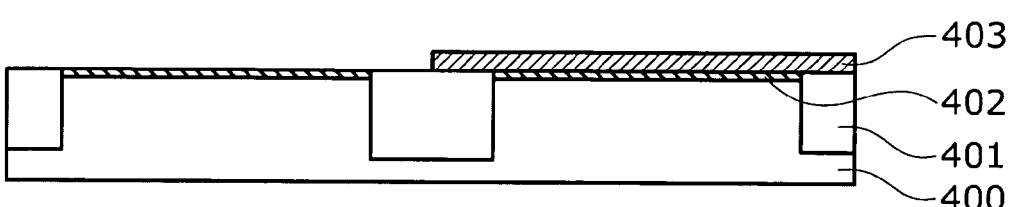
Figure 6C:
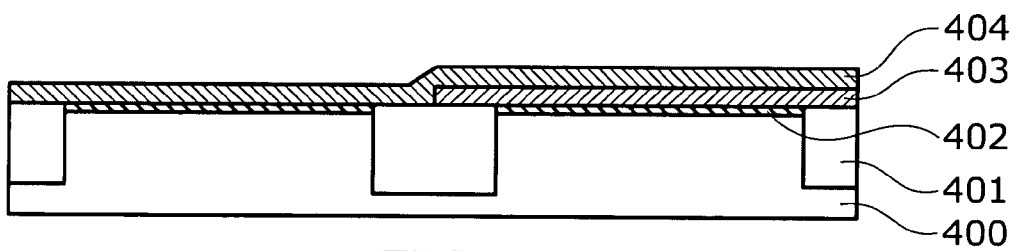

Next, as shown in FIG. 6B, for example, the TiN film 403 in the pMIS formation region is covered with a photoresist, which is then masked, and the TiN film 403 of the nMIS formation region is removed using an etching liquid such as hydrogen peroxide solution, with the TiN film 403 left behind on the gate insulating film 402 of the pMIS formation region. Furthermore, as shown in FIG. 6C, a second metal film containing silicon, for example, a TiSiN film 404 having a work function of 4.2 eV, is formed with a film thickness of 10 nm by CVD method, for example.

Figure 6D:
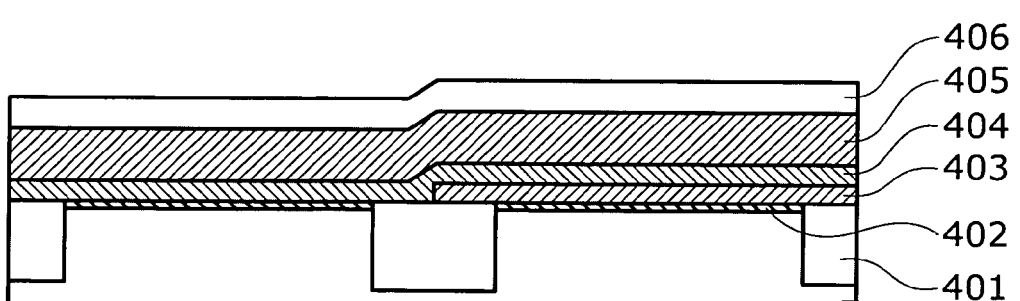

Next, as shown in FIG. 6D, in order to reduce the resistance of the MISFET, a third metal film having a lower resistance than the first metal film and the second metal film, for example, a W film 405, is formed over the upper surface of the TiSiN film 404. Furthermore, a silicon nitride film 406 is formed over the upper surface of the W film 405 by CVD or other method.

Figure 6E:
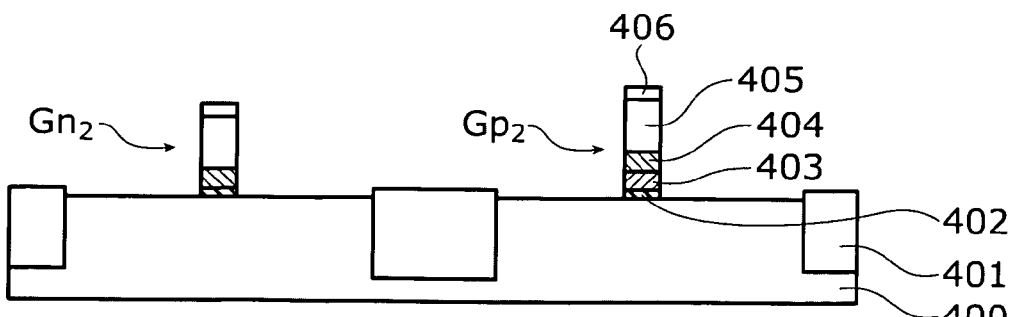

Next, as shown in FIG. 6E, the silicon nitride film 406, the W film 405, the TiSiN film 404, and the TiN film 403 are processed into, for example, a 30-nm gate length pattern by anisotropic etching to simultaneously form gate electrodes $Gn_2$, $GP_2$ having a gate length of 30 nm, for example, in the nMIS formation region and in the pMIS formation region, respectively. This anisotropic etching is conducted by dry etching with a plasma of $CF_4$ gas for the W film 405 and with a plasma of HBr gas for the TiSiN film 404 and the TiN film 403, for example.

Figure 7A:
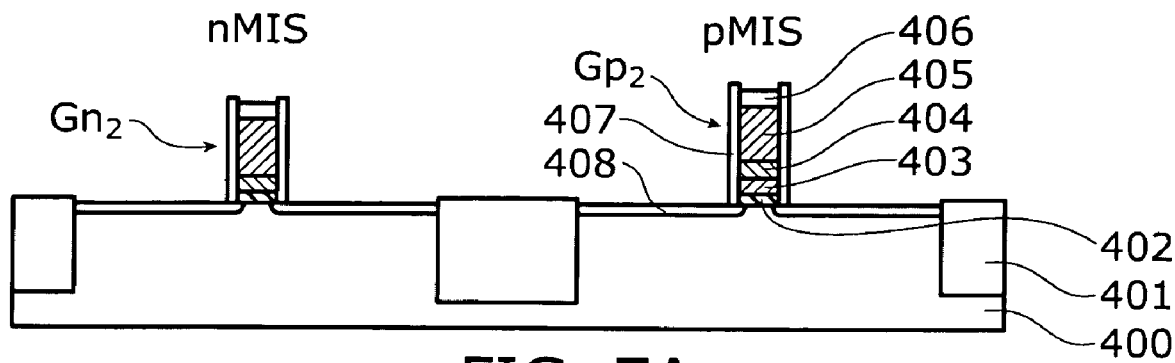

Subsequently, as shown in FIG. 7A, a silicon nitride film 407 is deposited on the single crystal silicon substrate 400. Then the silicon nitride film 407 is etched back by dry etching with a plasma of $CF_4$, for example, to make a configuration where the sidewall portion of the gate electrodes $Gn_2$, $Gp_2$ is surrounded by the silicon nitride film 407. Furthermore, the pMIS formation region is covered with a photoresist or the like, and the gate electrode $Gn_2$ is used as a mask to inject $As^+$ ions into the nMIS formation region. The nMIS formation region is covered with a photoresist or the like, and the gate electrode $Gp_2$ is used as a mask to inject $B^+$ ions into the pMIS formation region. Heat treatment is applied at 800° C. for 5 seconds to form a shallow diffusion layer 408 serving as a source/drain.

Figure 7B:
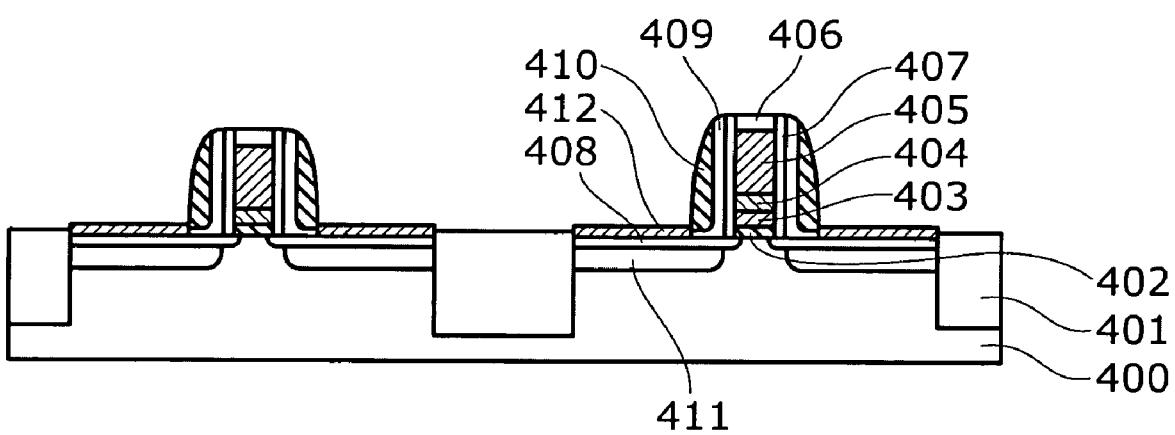

As shown in FIG. 7B, a silicon nitride film 409 and a silicon oxide film 410 are deposited again over the single crystal silicon substrate 400 and the gate electrodes $Gn_2$, $Gp_2$ by CVD method. Then the silicon oxide film 410 and the silicon nitride film 409 are etched back by dry etching with a plasma of $CF_4$, for example, to make a configuration where the sidewall portion of the gate electrodes $Gn_2$, $Gp_2$ is surrounded by the silicon nitride film 409 and the silicon oxide film 410. Furthermore, the pMIS formation region is covered with a photoresist or the like, and the gate electrode $Gn_2$ is used as a mask to inject $P^+$ ions into the nMIS formation region. The nMIS formation region is covered with a photoresist or the like, and the gate electrode $Gp_2$ is used as a mask to inject $B^+$ ions into the pMIS formation region. Heat treatment is applied at 1030° C. for 5 seconds to form a deep diffusion layer 411 serving as a source/drain.

Then a Ni film is deposited over the upper surface of the single crystal silicon substrate 400 to a film thickness of 10 nm by CVD or other method. Heat treatment is applied at 350° C. for about 30 seconds to allow Ni to react with the silicon substrate. Subsequently, the unreacted Ni film is removed by, for example, a liquid mixture of sulfuric acid and hydrogen peroxide solution. Then heat treatment is applied at 500° C. for about 30 seconds to form a silicide layer 412 on the shallow diffusion layer 408.

Figure 7C:
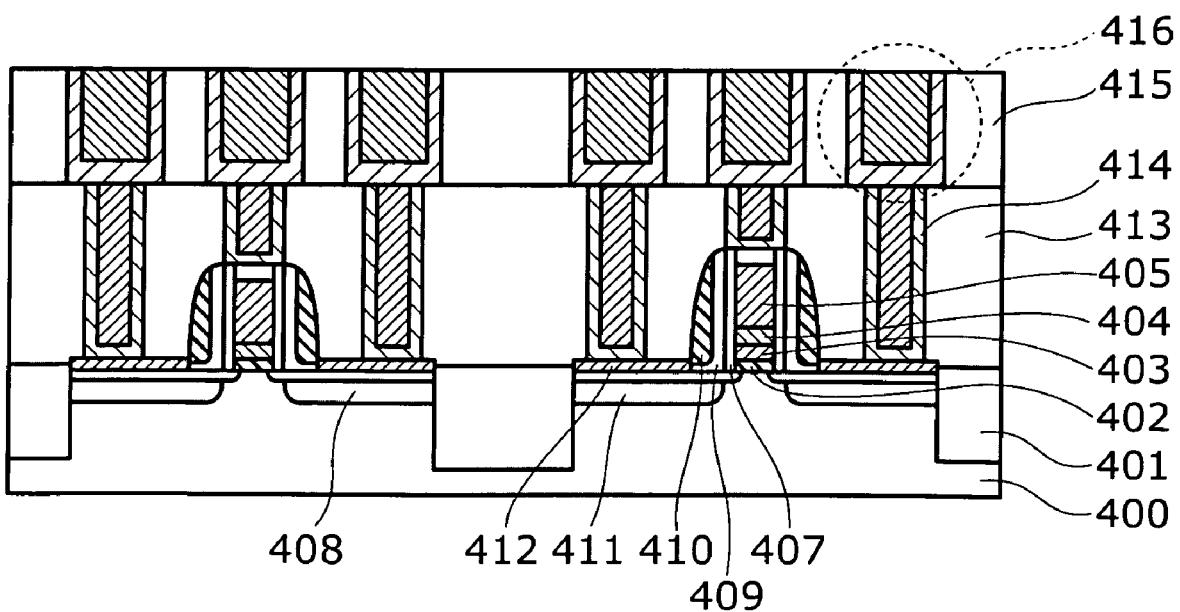

As shown in FIG. 7C, a first interlayer film 413 is deposited on the single crystal silicon substrate 400 by CVD method, for example. Then a desired contact pattern is formed by lithography. A Ti/TiN/W film, for example, is buried inside the contact pattern and planarized by CMP method to form a contact 414. Next, a second interlayer film 415 is deposited on the first interlayer film 413 and on the contact 414 by CVD method, for example. Then a desired groove pattern is formed by lithography. Subsequently, a TaN/Cu film, for example, is buried inside the groove and planarized by CMP method to form a Cu interconnect 416 that electrically connects the contact 414.

The foregoing process results in an FET having a dual metal gate structure made of an nMISFET gate electrode having a work function of 4.2 eV and a pMISFET gate electrode having a work function of 4.8 eV.

According to this embodiment, a metal electrode material containing silicon or germanium is not directly formed on the high dielectric gate insulating film 402 of the pMIS formation region to prevent the variation of the work function of the gate electrode in the pMIS formation region. Thus it becomes possible to manufacture a reliable semiconductor device having a dual metal gate structure with a desired threshold voltage made of an nMISFET gate electrode having a work function of 4.2 eV and a pMISFET gate electrode having a work function of 4.8 eV.

Furthermore, according to this embodiment, the first metal film and the second metal film serving as gate electrode materials use metal materials such that the major metallic elements contained in the metal films are in the same group of the periodic table. Therefore the first metal film and the second metal film can be processed with the same etching gas, which facilitates manufacturing a semiconductor device having a dual metal gate structure. Moreover, even if a portion of the second metal film stays behind at the peripheral vicinity of the first metal film in etching the second metal film, it can be etched away together with the first metal film during etching the first metal film. Thus it becomes possible to manufacture a semiconductor device having a dual metal gate structure without decreasing yield.

Moreover, in this embodiment, a W film 405 having a lower resistance than the first metal film and the second metal film is formed on the second metal film of the gate electrodes of the pMISFET formation region and the nMISFET formation region, and thereby the resistance of the gate electrodes can be reduced. Furthermore, when a metal film containing nitrogen such as the TiSiN film 404 is formed as a second metal film under the W film 405, this metal film containing nitrogen serves, during the heat treatment step, as a barrier layer for preventing the W film 405 from reacting with the first metal film formed under the metal film containing nitrogen. Thus the sheet resistance of the gate electrode can be improved.

While a W film 405 is used as the third metal film in order to reduce the resistance of the gate electrode in this embodiment, any metal film having a lower resistance than the first metal film and the second metal film, for example, an Al film or the like, may be used.

The invention is not limited to the above embodiments, but can be practiced in various modifications without departing from the spirit of the invention. For example, while the first metal film and the second metal film are made of metals containing W or Ti as the major metallic element in the above embodiments, the invention is not limited thereto. For example, the major metallic elements of the first metal film and the second metal film may be metallic elements in any one of groups IVa, Va, and VIa.

The above embodiments use a WN film 103 or a TiN film 403 as the first metal film, and a WSiN film 104 or a TiSiN film 404 as the second metal film. However, the invention is not limited thereto. The first metal film may be any metal film that does not contain silicon and germanium, and the second metal film may be any metal film containing silicon or germanium. By using such metal films as the first metal film and the second metal film, a gate electrode having a larger work function can be formed on the pMISFET side, and a gate electrode having a smaller work function can be formed on the nMISFET side. Thus a desired threshold voltage can be obtained for both the pMISFET and the nMISFET. However, even in these cases, preferably, the major metallic elements of the first metal film and the second metal film are metallic elements in the same group of the periodic table.

Furthermore, in the above embodiments, a Ni silicide produced by the reaction of Ni and silicon is formed on the gate electrode or on the diffusion layer of the silicon substrate. However, besides Ni, silicides of W, Ti, Mo, Co or the like may be formed.

Moreover, in the above embodiments, a Hf-based oxide film is used as the material of the high dielectric gate insulating film. However, besides Hf-based oxides, for example, oxides of Zr, Ti, Al, Sr, Y, La and the like, or oxides of these elements and silicon such as $ZrSi_xO_y$, may be used. Furthermore, laminated films of these oxides may be used.

The invention claimed is:

1. A method of manufacturing a semiconductor device, comprising:
    forming a high dielectric gate insulating film in an nMIS formation region and a pMIS formation region of a semiconductor substrate, the high dielectric gate insulating film having a dielectric constant higher than a dielectric constant of silicon oxide;
    forming a first metal film directly on the high dielectric gate insulating film, the first metal film not containing silicon and germanium;
    removing the first metal film in the nMIS formation region;
    forming a second metal film on the high dielectric gate insulating film of the nMIS formation region and on the first metal film of the pMIS formation region, the second metal film containing at least one of silicon and germanium, such that no silicon or germanium is present at an interface between the high dielectric gate insulating film and the first metal film in the pMIS formation region; and
    processing the first metal film and the second metal film.

2. A method of manufacturing a semiconductor device according to claim 1, further comprising between forming the second metal film and processing the first metal film and the second metal film:
    forming a silicon film on the second metal film; and
    processing the silicon film.

3. A method of manufacturing a semiconductor device according to claim 1, further comprising between forming the second metal film and processing the first metal film and the second metal film:
    forming a third metal film on the second metal film, the third metal film having a resistance lower than the first metal film and the second metal film; and
    processing the third metal film.

4. A method of manufacturing a semiconductor device according to claim 1, wherein the first metal film and the second metal film are processed using a same etching gas.

5. A method of manufacturing a semiconductor device according to claim 1, wherein major metallic elements contained in the first metal film and the second metal film are metallic elements in a same group of a periodic table.

6. A method of manufacturing a semiconductor device according to claim 1, wherein the high dielectric gate insulating film contains hafnium.

7. A method of manufacturing a semiconductor device according to claim 1, wherein the first metal film contains tungsten and nitrogen.

8. A method of manufacturing a semiconductor device according to claim 7, wherein the second metal film contains tungsten, nitrogen, and at least one of silicon and germanium.

9. A method of manufacturing a semiconductor device according to claim 1, wherein the first metal film contains titanium and nitrogen.

10. A method of manufacturing a semiconductor device according to claim 7, wherein the second metal film contains titanium, nitrogen, and at least one of silicon and germanium.

* * * * *